United States Patent
Hayashi

Patent Number: 6,133,732
Date of Patent: Oct. 17, 2000

[54] MAGNETORESISTIVE EFFECT ELEMENT AND SHIELD MAGNETORESISTIVE EFFECT SENSOR

[75] Inventor: Kazuhiko Hayashi, Tokyo, Japan

[73] Assignee: NEC Corporation, Tokyo, Japan

[21] Appl. No.: 08/975,053

[22] Filed: Nov. 20, 1997

[30] Foreign Application Priority Data

Nov. 21, 1996 [JP] Japan ..................... 8-310568

[51] Int. Cl.[7] ............. G01R 33/02; G11B 5/39; H01L 43/02
[52] U.S. Cl. ............ 324/252; 338/32 R; 360/113; 428/692
[58] Field of Search ................ 324/252, 207.21, 324/235; 338/32 R; 360/113; 428/692, 900

[56] References Cited

U.S. PATENT DOCUMENTS

| | | | |
|---|---|---|---|
| 5,739,988 | 4/1998 | Gill | 360/113 |
| 5,955,211 | 9/1999 | Maeda et al. | 324/252 |

FOREIGN PATENT DOCUMENTS

| | | |
|---|---|---|
| 7-78313 | 3/1995 | Japan . |
| 7-262529 | 10/1995 | Japan . |
| 7-307502 | 11/1995 | Japan . |
| 8-203035 | 8/1996 | Japan . |
| 8-213238 | 8/1996 | Japan . |

OTHER PUBLICATIONS

David A. Thompson et al., "Thin film magnetoresistors in memory, storage, and related applications", pp. 1039–1050, IEEE Transactions on Magnetics, vol. Mag–11, No. 4, Jul. 1975.

*Primary Examiner*—Walter E. Snow
*Attorney, Agent, or Firm*—Young & Thompson

[57] ABSTRACT

A magnetoresistive effect element comprises a base layer, an antiferromagnetic layer extending over the base layer, a pinned magnetic layer extending over the antiferromagnetic layer, a first non-magnetic layer extending over the pinned magnetic layer, and a free magnetic layer extending over the first non-magnetic layer, wherein the pinned magnetic layer includes at least one selected from the group consisting of Co-based materials, Ni-based materials, Fe-based materials and alloys thereof, and wherein the free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZr-MoNi.

42 Claims, 8 Drawing Sheets

1 : substrate
2 : bottom shielding layer
3 : bottom gap layer
4 : vertical bias layer
5 : bottom electrode layer
6 : magnetoresistive effect element
7 : gap definition insulation layer
8 : top gap layer
9 : top shielding layer 1 : substrate
2 : bottom shielding layer
3 : bottom gap layer
4 : vertical bias layer
5 : bottom electrode layer
6 : magnetoresistive effect element
7 : gap definition insulation layer
8 : top gap layer
9 : top shielding layer 11 : base layer
12 : anti-ferromagnetic layer
13 : pinned magnetic layer
15 : non-magnetic layer
17 : free magnetic layer
18 : protection layer 11 : base layer
12 : anti-ferromagnetic layer
13 : pinned magnetic layer
14 : first magnetoresistive effect enhanced layer
15 : non-magnetic layer
16 : second magnetoresistive effect enhanced layer
17 : free magnetic layer
18 : protection layer 11 : base layer
12 : anti-ferromagnetic layer
13 : pinned magnetic layer
15 : non-magnetic layer
17 : free magnetic layer
18 : protection layer 11 : base layer
12 : anti-ferromagnetic layer
13 : pinned magnetic layer
14 : first magnetoresistive effect enhanced layer
15 : non-magnetic layer
16 : second magnetoresistive effect enhanced layer
17 : free magnetic layer
18 : protection layer 1 : substrate
2 : bottom shielding layer
3 : bottom gap layer
4 : vertical bias layer
5 : bottom electrode layer
6 : magnetoresistive effect element
8 : top gap layer
9 : top shielding layer 30 : substrate
31 : bottom shielding layer
32 : magnetoresistive effect element
33 : electrodes
34 : top shielding layer
36 : bottom magnetic layer
37 : coils
38 : top magnetic layer 33 : electrodes
50 : substrate
51 : magnetoresistive effect element
81 : magnetic field direction
83 : magnetic layer
100 : magnetic medium

MAGNETORESISTIVE EFFECT ELEMENT AND SHIELD MAGNETORESISTIVE EFFECT SENSOR

BACKGROUND OF THE INVENTION

The present invention relates to an improved magnetoresistive effect element for reading information magnetically stored in a magnetic recording medium, and an improved shield magnetoresistive effect sensor using the magnetoresistive effect element.

The magnetoresistive effect element is capable of sensing variations of resistance, which may be regarded to be a function of intensity of magnetic flux. The magnetoresistive effect sensor is capable of detecting magnetic signals through the magnetoresistive effect element for reading out of data magnetically stored in a magnetic recording medium at a large linear density. The conventional magnetoresistive effect element utilizes the anisotropic magnetoresistive effect element which is defined to be a phenomenon of variation in resistance of the element proportionally to the square of cosine of an angle defined between a magnetization direction and a sensing current flowing through the element. The anisotropic magnetoresistive effect is described in detail by D. A. Thomson et al. "Memory Storage and Related Applications", IEEE Transaction on Mag. MAG-11, p. 1039 (1975). The magnetoresistive effect sensor using the magnetoresistive effect element is often applied with vertical bias in order to suppress Barkhausen noises. This vertical bias may be applied to anti-ferromagnetics such as FeMn, NiMn, and nickel oxide.

In recent years, a magnetoresistive effect element having a spin valve film has been developed. Such magnetoresistive effect element having a spin valve film utilizes a giant magnetoresistive effect. This giant magnetoresistive effect is a phenomenon of variation in resistance of the element both due to a spin-conservative transmission of conduction electrons between ferromagnetic layers which sandwich a non-magnetic layer and due to a spin-conservative scattering of the conduction electrons on interfaces between the ferromagnetic and non-magnetic layers. This magnetoresistive effect element shows variation in plane resistance between the ferromagnetic layers isolated by the non-magnetic layer in proportion to the cosine of an angle defined between the magnetization directions of the two ferromagnetic layers. As compared to the anisotropic magnetoresistive effect element, has second occurance the giant magnetoresistive effect element improved sensitivity and shows a larger variation in resistance.

In Japanese laid-open patent publication No. 2-61572, it is disclosed that a laminated magnetic structure shows a large. magnetoresistance variation due to anti-parallel order of magnetization in the magnetic layers. Ferromagnetic transition metals and alloys thereof are available for the laminated structure. It is further disclosed that an antiferromagnetic layer is added to one of the paired ferromagnetic layers isolated by the intermediate layer. FeMn is suitable for the anti-ferromagnetic layer.

In Japanese laid-open patent publication No. 4-358310, it is disclosed that the magnetoresistive effect element has two thin ferromagnetic layers isolated by a thin non-magnetic metal layer, where if an applied magnetic field is zero, then the magnetization directions of the two ferromagnetic thin layers are different by the right angle The two ferromagnetic layers isolated from each other by the intermediate layer vary in resistance in proportion to the cosine of an angle defined between the magnetization directions of those two layers but independently from a direction of current flowing through the sensor.

In Japanese laid-open patent publication No. 6-203340, it is disclosed that the magnetoresistive effect sensor has two ferromagnetic thin layers isolated by a non-magnetic metal thin layer, where if an externally applied magnetic field is zero, then anti-ferromagnetic layers adjacent to each other are kept to differ in magnetization direction by the right angle.

In Japanese laid-open patent publication No. 7-262529, it is disclosed that a spin valve comprises laminations of a first magnetic layer, a non-magnetic layer, a second magnetic layer and an anti-ferromagnetic layer. The first and second magnetic layers are made of CoZrNb, CoZrMo, FeSiAl, FeSi, or NiFe which is undoped or doped with Cr, Mn, Ni, Cu, Ag, Al, Ti, Fe, Co or Zn.

If the magnetoresistive effect head or transducer is operated for reproducing at a constant sense current value, then an output thereof is proportional to the amount of variation in resistance of the element. This amount of variation in resistance is defined to be the product of the rate of resistance variation and the resistance of the element. Thus, the output is large as the resistivity of the element is high. In order to increase the output of the magnetoresistive effect head or transducer, it is required to increase the resistance of the element with keeping a rate of resistance variation which is equal to or higher than the rate of resistance variation of the conventional element. In order to achieve this issue, it is effective to use materials having a high resistivity such as amorphous alloys. If, however, the materials having a high resistivity such as amorphous alloys are used for a pinned magnetic layer, then a unidirectional anisotropy of magnetic field applied from an anti-ferromagnetic layer to the pinned magnetic layer is small.

In the above circumstances, it had been required to develop an improved magnetoresistive effect element free from the above problems and disadvantages, namely to obtain a large reproducing output with a sufficiently large exchange-coupling magnetic field from the anti-ferromagnetic layer to the pinned magnetic layer

SUMMARY OF THE INVENTION

Accordingly, it is an object of the present invention to provide an improved magnetoresistive effect element free from the above problems and disadvantages.

It is an object of the present invention to provide an improved magnetoresistive effect element showing not only a large exchange-coupling magnetic field applied from an anti-ferromagnetic layer to a pinned magnetic layer but also a large reproducing output thereof.

It is another object of the present invention to provide an improved magnetoresistive effect sensor free from the above problems and disadvantages.

It is still another object of the present invention to provide an improved magnetoresistive effect sensor showing not only a large exchange-coupling magnetic field applied from an anti-ferromagnetic layer to a pinned magnetic layer but also a large reproducing output thereof.

The above and other objects, features and advantages of the present invention will be apparent from the following descriptions.

The present invention provides a multi-layer structure comprising an antiferromagnetic layer, a pinned magnetic layer in contact with the antiferromagnetic layer, and an additional layered region in contact with the pinned magnetic layer so that the pinned magnetic layer is sandwiched between the antiferromagnetic layer and the additional layered region, wherein the pinned magnetic layer includes at least one selected from the group consisting of Co-based materials, Ni-based materials, Fe-based materials and alloys thereof, and wherein the additional layered region includes at least a first layer including at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The second present invention provides a multi-layer structure comprising an antiferromagnetic layer, a pinned magnetic layer in contact with the antiferromagnetic layer, a first non-magnetic layer in contact with the pinned magnetic layer so that the pinned magnetic layer is sandwiched between the first non-magnetic layer and the antiferromagnetic layer, and at least a free magnetic layer in contact with the first non-magnetic layer so that the first non-magnetic layer is sandwiched between the pinned magnetic layer and the at least a free magnetic layer, wherein the pinned magnetic layer includes at least one selected from the group consisting of Co-based materials, Ni-based materials, Fe-based materials and alloys thereof, and wherein the at least a free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The present invention further provides a multi-layer structure comprising an antiferromagnetic layer, a pinned magnetic layer in contact with the antiferromagnetic layer, an intermediate layer including at least a first non-magnetic layer and the at least a magnetoresistive effect enhanced layer and being in contact with the pinned magnetic layer so that the pinned magnetic layer is sandwiched between the intermediate layer and the anti-ferromagnetic layer, at least a free magnetic layer in contact with the intermediate layer so that the intermediate layer is sandwiched between the pinned magnetic layer and the at least a free magnetic layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

BRIEF DESCRIPTION OF THE DRAWINGS

Preferred embodiments according to the present invention will be described with reference to the accompanying drawings.

DESCRIPTION OF THE PREFERRED EMBODIMENT

Figure 1:
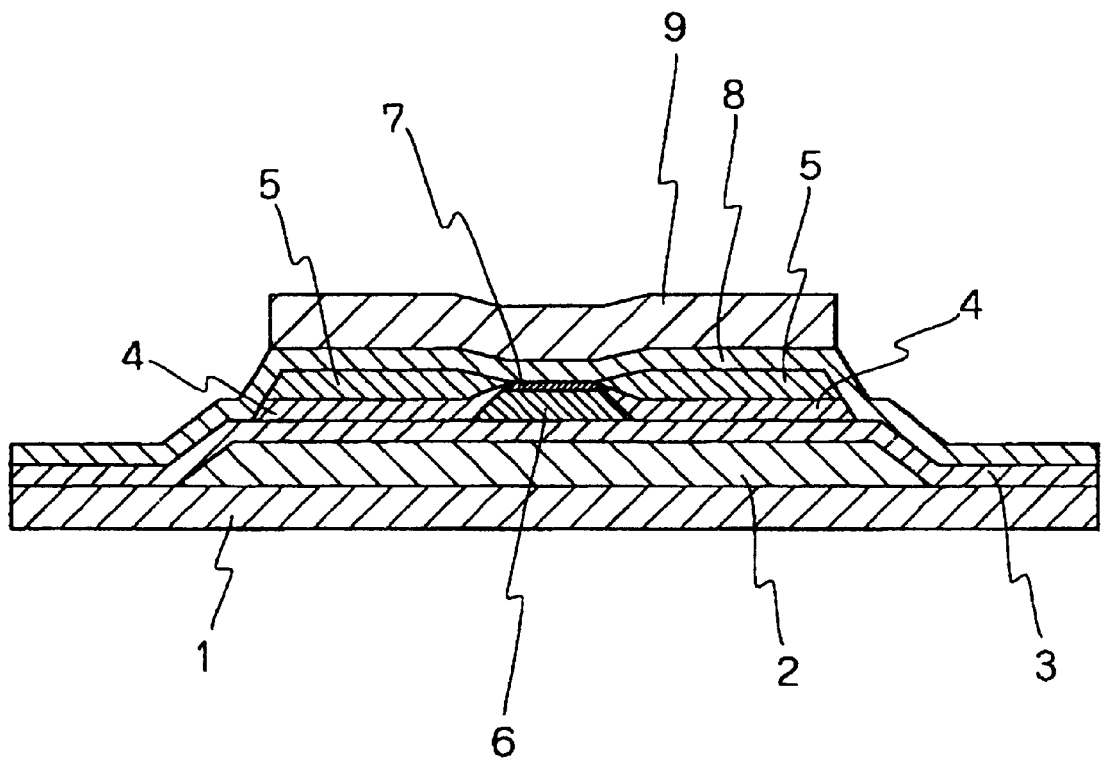
FIG. 1 is a fragmentary cross sectional elevation view illustrative of a magnetoresistive effect sensor in accordance with the present invention.

The first present invention provides a multi-layer structure comprising an antiferromagnetic layer, a pinned magnetic layer in contact with the antiferromagnetic layer, and an additional layered region in contact with the pinned magnetic layer so that the pinned magnetic layer is sandwiched between the antiferromagnetic layer and the additional layered region, wherein the pinned magnetic layer includes at least one selected from the group consisting of Co-based materials, Ni-based materials, Fe-based materials and alloys thereof, and wherein the additional layered region includes at least a first layer including at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The above at least first layer may be at least a free magnetic layer. The additional layered region may further comprises a first non-magnetic layer and at least a free magnetic layer. The first non-magnetic layer may be in contact with the pinned magnetic layer so that the pinned magnetic layer is sandwiched between the first non-magnetic layer and the anti-ferromagnetic layer. The free magnetic layer may be in contact with the first non-magnetic layer so that the first non-magnetic layer is sandwiched between the pinned magnetic layer and the at least a free magnetic layer. The free magnetic layer may further comprise a first free magnetic layer, a second non-magnetic layer and a second free magnetic layer. The first free magnetic layer may be in contact with the first non-magnetic layer so that the first non-magnetic layer is sandwiched between the pinned magnetic layer and the first free magnetic layer. The second non-magnetic layer may be in contact with the first free magnetic layer so that the first free magnetic layer is sandwiched between the first non-magnetic layer and the second non-magnetic layer. The second free magnetic layer may be in contact with the second non-magnetic layer so that the second non-magnetic layer is sandwiched between the first free magnetic layer and the second free magnetic layer.

The first layer may be at least a magnetoresistive effect enhanced layer. The additional layered region may firer comprises an intermediate layer and at least a free magnetic layer. The intermediate layer may be in contact with the pinned magnetic layer so that the pinned magnetic layer is sandwiched between the intermediate layer and the antiferromagnetic layer, the intermediate layer including at least a first non-magnetic layer and the at least a magnetoresistive effect enhanced layer. The free magnetic layer may be in contact with the intermediate layer so that the intermediate layer is sandwiched between the pinned magnetic layer and the at least a free magnetic layer. The intermediate layer may further comprise a first magnetoresistive effect enhanced layer, a first non-magnetic layer, a second magnetoresistive effect enhanced layer. The first magnetoresistive effect enhanced layer may be in contact with the pinned magnetic layer so that the pinned magnetic layer is sandwiched between the first magnetoresistive effect enhanced layer and the anti-ferromagnetic layer. The first non-magnetic layer may be in contact with the first magnetoresistive effect enhanced layer so that the first magnetoresistive effect enhanced layer is sandwiched between the pinned magnetic layer and the first non-magnetic layer. The second magnetoresistive effect enhanced layer may be in contact with the second non-magnetic layer so that the first non-magnetic layer is sandwiched between the first magnetoresistive effect enhanced layer and the second magnetoresistive effect enhanced layer. Alternatively, the intermediate layer may comprise a first magnetoresistive effect enhanced layer and a first non-magnetic layer. The first magnetoresistive effect enhanced layer may be in contact with the pinned magnetic layer so that the pinned magnetic layer is sandwiched between the first magnetoresistive effect enhanced layer and the anti-ferromagnetic layer. The first non-magnetic layer may be in contact with the first magnetoresistive effect enhanced layer so that the first magnetoresistive effect enhanced layer is sandwiched between the pinned magnetic layer and the first non-magnetic layer. Further alternatively, the intermediate layer may comprise a first non-magnetic layer and a first magnetoresistive effect enhanced layer. The first non-magnetic layer may be in contact with the pinned magnetic layer so that the pinned magnetic layer is sandwiched between the first non-magnetic layer and the anti-ferromagnetic layer. The first magnetoresistive effect enhanced layer may be in contact with the first non-magnetic layer so that the first non-magnetic layer is sandwiched between the pinned magnetic layer and the first magnetoresistive effect enhanced layer.

The free magnetic layer may comprise a first free magnetic layer, a second non-magnetic layer and a second free magnetic layer. The first free magnetic layer may be in contact with the intermediate layer so that the intermediate layer is sandwiched between the pinned magnetic layer and the first free magnetic layer. The second non-magnetic layer may be in contact with the first free magnetic layer so that the first free magnetic layer is sandwiched between the intermediate layer and the second non-magnetic layer. The second free magnetic layer may be in contact with the second non-magnetic layer so that the second non-magnetic layer is sandwiched between the first free magnetic layer and the second free magnetic layer.

The free magnetic layer may be made of the same material as the at least a magnetoresistive effect enhanced layer. Alternatively, the free magnetic layer may be made of a material which is different from the at least a magnetoresistive effect enhanced layer, and which includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The pinned magnetic layer may comprise a single layer made of at least one selected from the group consisting of Co-based materials, Ni-based materials, Fe-based materials and alloys thereof. Alternatively, the pinned magnetic layer may comprise a plurality of laminated layers, each of which is made of at least one selected from the group consisting of Co-based materials, Ni-based materials, Fe-based materials and alloys thereof The plurality of laminated layers may be made of the same material as each other. Alternatively, the plurality of laminated layers may be made of different materials from each other. The plurality of laminated layers may be separated from each other by at least a third non-magnetic layer It is further possible to provide a base layer in contact with the anti-ferroelectric layer so that the anti-ferroelectric layer is sandwiched between the base layer and the pinned magnetic layer. Alternatively, it is also possible to further a base layer in contact with the additional layered region so that the additional layered region is sandwiched between the base layer and the pinned magnetic layer.

The first layer may be made of one selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

The second present invention provides a multi-layer structure comprising an antiferromagnetic layer, a pinned magnetic layer in contact with the antiferromagnetic layer, a first non-magnetic layer in contact with the pinned magnetic layer so that the pinned magnetic layer is sandwiched between the first non-magnetic layer and the anti-ferromagnetic layer, and at least a free magnetic layer in contact with the first non-magnetic layer so that the first non-magnetic layer is sandwiched between the pinned magnetic layer and the at least a free magnetic layer, wherein the pinned magnetic layer includes at least one selected from the group consisting of Co-based materials, Ni-based materials, Fe-based materials and alloys thereof, and wherein the at least a free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The free magnetic layer may comprise a first free magnetic layer, a second non-magnetic layer, and a second free magnetic layer. The first free magnetic layer may be in contact with the first non-magnetic layer so that the first non-magnetic layer is sandwiched between the pinned magnetic layer and the first free magnetic layer. The second non-magnetic layer may be in contact with the first free magnetic layer so that the first free magnetic layer is sandwiched between the first non-magnetic layer and the second non-magnetic layer. The second free magnetic layer may be in contact with the second non-magnetic layer so that the second non-magnetic layer is sandwiched between the first free magnetic layer and the second free magnetic layer.

The pinned magnetic layer may comprise a single layer made of at least one selected from the group consisting of Co-based materials, Ni-based materials, Fe-based materials and alloys thereof. Alternatively, the pinned magnetic layer may comprise a plurality of laminated layers, each of which is made of at least one selected from the group consisting of Co-based materials, Ni-based materials, Fe-based materials and alloys thereof. The plurality of laminated layers may be made of the same material as each other. Alternatively, the plurality of laminated layers may be made of different materials from each other The plurality of laminated layers may be separated from each other by at least a third non-magnetic layer.

It is possible to provide a base layer in contact with the anti-ferroelectric layer so that the anti-ferroelectric layer is sandwiched between the base layer and the pinned magnetic layer. Alternatively, it is possible to further provide a base layer in contact with the at least a free magnetic layer so that the at least a free magnetic layer is sandwiched between the base layer and the first non-magnetic layer.

The free magnetic layer may be made of one selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

The third present invention provides a multi-layer structure comprising an antiferromagnetic layer, a pinned magnetic layer in contact with the antiferromagnetic layer, an intermediate layer including at least a first non-magnetic layer and the at least a magnetoresistive effect enhanced layer and being in contact with the pinned magnetic layer so that the pinned magnetic layer is sandwiched between the intermediate layer and the anti-ferromagnetic layer, at least a free magnetic layer in contact with the intermediate layer so that the intermediate layer is sandwiched between the pinned magnetic layer and the at least a free magnetic layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The intermediate layer may comprise a first magnetoresistive effect enhanced layer, a first non-magnetic layer and a second magnetoresistive effect enhanced layer. The first magnetoresistive effect enhanced layer may be in contact with the pinned magnetic layer so that the pinned magnetic layer is sandwiched between the first magnetoresistive effect enhanced layer and the anti-ferromagnetic layer. The first non-magnetic layer may be in contact with the first magnetoresistive effect enhanced layer so that the first magnetoresistive effect enhanced layer is sandwiched between the pinned magnetic layer and the first non-magnetic layer. The second magnetoresistive effect enhanced layer may be in contact with the second non-magnetic layer so that the first non-magnetic layer is sandwiched between the first magnetoresistive effect enhanced layer and the second magnetoresistive effect enhanced layer.

The intermediate layer may comprise a first magnetoresistive effect enhanced layer and a first non-magnetic layer. The first magnetoresistive effect enhanced layer may be in contact with the pinned magnetic layer so that the pinned magnetic layer is sandwiched between the first magnetoresistive effect enhanced layer and the anti-ferromagnetic layer. The first non-magnetic layer may be in contact with the first magnetoresistive effect enhanced layer so that the first magnetoresistive effect enhanced layer is sandwiched between the pinned magnetic layer and the first non-magnetic layer. The may alternatively comprise a first non-magnetic layer and a first magnetoresistive effect enhanced layer. The first non-magnetic layer may be in contact wit the pinned magnetic layer so that the pinned magnetic layer is sandwiched between the first non-magnetic layer and the anti-ferromagnetic layer. The first magnetoresistive effect enhanced layer may be in contact with the first non-magnetic layer so that the first non-magnetic layer is sandwiched between the pinned magnetic layer and the first magnetoresistive effect enhanced layer.

The free magnetic layer may comprise a first free magnetic layer, a second non-magnetic layer and a second free magnetic layer. The first free magnetic layer may be in contact with the intermediate layer so that the intermediate layer is sandwiched between the pinned magnetic layer and the first free magnetic layer. The second non-magnetic layer may be in contact with the first free magnetic layer so that the first free magnetic layer is sandwiched between the intermediate layer and the second non-magnetic layer. The second free magnetic layer may be in contact with the second non-magnetic layer so that the second non-magnetic layer is sandwiched between the first free magnetic layer and the second free magnetic layer. The free magnetic layer may be made of the same material as the at least a magnetoresistive effect enhanced layer. The free magnetic layer may alternatively be made of a material which is different from the at least a magnetoresistive effect enhanced layer, and which includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The pinned magnetic layer may comprise a single layer made of at least one selected from the group consisting of Co-based materials, Ni-based materials, Fe-based materials and alloys thereof. The pinned magnetic layer may alternatively comprise a plurality of laminated layers, each of which is made of at least one selected from the group consisting of Co-based materials, Ni-based materials, Fe-based materials and alloys thereof. The plurality of laminated layers may be made of the same material as each other. The plurality of laminated layers may be made of different materials from each other. The plurality of laminated layers may be separated from each other by at least a third non-magnetic layer.

It is possible to provide a base layer in contact with the anti-ferroelectric layer so that the anti-ferroelectric layer is sandwiched between the base layer and the pinned magnetic layer. It is also possible to provide a base layer in contact with the at least a free magnetic layer so that the at least a free magnetic layer is sandwiched between the base layer and the first non-magnetic layer.

The free magnetic layer may be made of one selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

The fourth present invention provides a magnetoresistive effect element comprising a base layer, an antiferromagnetic layer extending over the base layer; a pinned magnetic layer extending over the antiferromagnetic layer, a first non-magnetic layer extending over the pinned magnetic layer, and a free magnetic layer extending over the first non-magnetic layer, wherein the pinned magnetic layer includes at least one selected from the group consisting of Co-based materials, Ni-based materials, Fe-based materials and alloys thereof, and wherein the free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The fifth present invention provides a magnetoresistive effect element comprising a base layer, a free magnetic layer extending over the base layer, a first non-magnetic layer extending over the free magnetic layer, a pinned magnetic layer extending over the first non-magnetic layer, and an antiferromagnetic layer extending over the pinned magnetic layer, wherein the pinned magnetic layer includes at least one selected from the group consisting of Co-based materials, Ni-based materials, Fe-based materials and alloys thereof, and wherein the free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The sixth present invention provides a magnetoresistive effect element comprising a base layer, an antiferromagnetic layer extending over the base layer, a pinned magnetic layer extending over the antiferromagnetic layer, an intermediate layer extending over the pinned magnetic layer, the intermediate layer including at least a first non-magnetic layer and the at least a magnetoresistive effect enhanced layer, and a free magnetic layer extending over the intermediate layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The seventh present invention provides a magnetoresistive effect element comprising a base layer, a free magnetic layer extending over the base layer, an intermediate layer extending over the free magnetic layer, and including at least a first non-magnetic layer and the at least a magnetoresistive effect enhanced layer, a pinned magnetic layer extending over the intermediate layer, and an antiferromagnetic layer extending over the pinned magnetic layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The eighth present invention provides a magnetoresistive effect sensor comprising a substrate, a bottom shielding layer selectively provided on a part of the substrate, a bottom gap layer extending over the bottom shielding layer and the substrate, a magnetoresistive effect element selectively provided on a predetermined area of the bottom gap layer, a vertical bias layer selectively provided which extends over the bottom gap layer and also so extends as to be in contact partially with the magnetoresistive effect element, a bottom electrode layer provided on the vertical bias layer, a top gap layer extending over the magnetoresistive effect element, the bottom electrode layer and the bottom gap layer, and a top shielding layer provided on the top gap layer. The magnetoresistive effect element further comprises a base layer formed on the bottom gap layer, an antiferromagnetic layer extending over the base layer, a pinned magnetic layer extending over the antiferromagnetic layer, a first non-magnetic layer extending over the pinned magnetic layer, and a free magnetic layer extending over the first non-magnetic layer, wherein the pinned magnetic layer includes at least one selected from the group consisting of Co-based materials, Ni-based materials, Fe-based materials and alloys thereof, and wherein the free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo;, CoZrNb, CoZr, CoZrTa, CoHf, CoTa, CoTaHf, CoNbHf, CoHfPd, CoTaZrNb and CoZrMoNi.

The ninth present invention provides a magnetoresistive effect sensor comprising a substrate, a bottom shielding layer selectively provided on a part of the substrate, a bottom gap layer extending over the bottom shielding layer and the substrate, a magnetoresistive effect element selectively provided on a predetermined area of the bottom gap layer, a vertical bias layer selectively provided which extends over the bottom gap layer and also so extends as to be in contact partially with the magnetoresistive effect element, a bottom electrode layer provided on the vertical bias layer, a top gap layer extending over the magnetoresistive effect element, the bottom electrode layer and the bottom gap layer, and a top shielding layer provided on the top gap layer. The magnetoresistive effect element may comprises a base layer formed on the bottom gap layer, a free magnetic layer extending over the base layer, a first non-magnetic layer extending over the free magnetic layer, a pinned magnetic layer extending over the first non-magnetic layer, and an antiferromagnetic layer extending over the pinned magnetic layer, wherein the pinned magnetic layer includes at least one selected from the group consisting of Co-based materials, Ni-based materials, Fe-based materials and alloys thereof, and wherein the free magnetic layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The tenth present invention provides a magnetoresistive effect sensor comprising a substrate, a bottom shielding layer selectively provided on a part of the substrate, a bottom gap layer extending over the bottom shielding layer and the substrate, a magnetoresistive effect element selectively provided on a predetermined area of the bottom gap layer, a vertical bias layer selectively provided which extends over the bottom gap layer and also so extends as to be in contact partially with the magnetoresistive effect element, a bottom electrode layer provided on the vertical bias layer, a top gap layer extending over the magnetoresistive effect element, the bottom electrode layer and the bottom gap layer, and a top shielding layer provided on the top gap layer. The magnetoresistive effect element further comprises a base layer formed on the bottom gap layer, an antiferromagnetic layer extending over the base layer, a pinned magnetic layer extending over the antiferromagnetic layer, an intermediate layer extending over the pinned magnetic layer and including at least a first non-magnetic layer and the at least a magnetoresistive effect enhanced layer, and a free magnetic layer extending over the intermediate layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

The eleventh present invention provides a magnetoresistive effect sensor comprising a substrate, a bottom shielding layer selectively provided on a part of the substrate, a bottom gap layer extending over the bottom shielding layer and the substrate, a magnetoresistive effect element selectively provided on a predetermined area of the bottom gap layer, a vertical bias layer selectively provided which extends over the bottom gap layer and also so extends as to be in contact partially with the magnetoresistive effect element, a bottom electrode layer provided on the vertical bias layer, a top gap layer extending over the magnetoresistive effect element, the bottom electrode layer and the bottom gap layer, and a top shielding layer provided on the top gap layer. The magnetoresistive effect element comprises a base layer formed on the bottom gap layer, a free magnetic layer extending over the base layer, an intermediate layer extending over the free magnetic layer, the intermediate layer including at least a first non-magnetic layer and the at least a magnetoresistive effect enhanced layer, and a pinned magnetic layer extending over the intermediate layer, an antiferromagnetic layer extending over the pinned magnetic layer, wherein the pinned magnetic layer includes at least one selected from the group consisting of Co-based materials, Ni-based materials, Fe-based materials and alloys thereof, and wherein the at least a magnetoresistive effect enhanced layer includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

In accordance with the foregoing present invention, the pinned magnetic layer is provided in contact with the anti-ferromagnetic layer, for which reason a magnitude of the exchange-coupling magnetic field as a particularly important factor depends upon the lamination structure of the base layer, the anti-ferromagnetic layer and the pinned magnetic layer, but is independent from influences of the magnetoresistive effect enhanced layer and the free magnetic layer. The above lamination structure of the base layer, the anti-ferromagnetic layer and the pinned magnetic layer is capable of providing a sufficiently large magnitude of the exchange-coupling magnetic field to the pinned magnetic layer for enabling stable performances and operations of the magnetoresistive effect element and the magnetoresistive effect sensor.

A novel magnetoresistive effect sensor in accordance with the present invention will be described in more detail with reference to FIG. 1. The magnetoresistive effect sensor is formed on a substrate 1. A bottom shielding layer 2 is selectively provided on a top surface of the substrate 1. The bottom shielding layer 2 has a sloped edge. A bottom gap layer 3 is further provided which extends over the bottom shielding layer 2 and the substrate 1. A magnetoresistive effect element 6 is selectively provided on a center area of the top surface of the bottom gap layer 3. The magnetoresistive effect element 6 has a sloped edge. An insulation layer 7 is provided on a top surface of the magnetoresistive effect element 6. A vertical bias layer 4 is formed around the magnetoresistive effect element 6 and on the top surface of the bottom gap layer 3. The vertical bias layer 4 extends over the sloped edges of the magnetoresistive effect element 6. The vertical bias layer 4 does not extend over the sloped portion of the bottom gap layer 3. Bottom electrode layers 5 are provided which extend over the vertical bias layer 4. The bottom electrode layers 5 do not extend over the insulation layer 7. A gap between the bottom electrode layers 5 is defined by the plane size of the insulation layer 7. A top gap layer 8 is entirely provided which extends over the top surface of the insulation layer 7, the top surface and sloped edges of the bottom electrode layer 5, the sloped edges of the vertical bias layer 4, the sloped portions and the low-leveled portions of the bottom gap layer 3. A top shielding layer 9 is provided which extends over the top surface of the top gap layer 8.

The bottom shielding layer 2 may be made of one selected from the group consisting of alloys based on NiFe, CoZr, CoFeB, CoZrMo, CoZrNb, CoZr, CoZrTa, CoHf, CoTa, CoTaHf, CoNbHf, CoHfPd, CoTaZrNb and CoZrMoNi, and FeAlSi (Sendust), iron nitride based materials. The bottom shielding layer 2 may have a thickness in the range of 0.5–10 micrometers. The bottom gap layer 3 may be made of one selected from the group consisting of aluminum oxide, silicone dioxide, aluminum nitride, silicon nitride, diamond like carbon and the like. The bottom gap layer 3 may preferably have a thickness in the range of 0.01–0.20 micrometers. The bottom electrode layer 5 may be made of one selected from the group consisting of Zr, Ta, Mo, alloys thereof, and mixture thereof. The bottom electrode layer 5 may have a thickness preferably in the range of 0.01–0.10 micrometers. The vertical bias layer 4 may be made of one selected from the group consisting of CoCrPt, CoCr, CoPt, CoCrTa, FeMn, NiMn, NiO, NiCoO, IrMn, PtPdMn, ReMn, and the like. The gap defining insulation layer 7 may be made of one selected from the group consisting of aluminum oxide, silicone dioxide, aluminum nitride, silicon nitride, diamond like carbon and the like. The gap defining insulation layer 7 may have a thickness preferably in the range of 0.005–0.05 micrometers. The top gap layer 8 may be made of one selected from the group consisting of aluminum oxide, silicone dioxide, aluminum nitride, silicon nitride, diamond like carbon and the like. The top gap layer 8 may preferably have a thickness in the range of 0.01–0.20 micrometers. The top shielding layer 9 may be made of one selected from the group consisting of alloys based on NiFe, CoZr, CoFeB, CoZrMo, CoZrNb, CoZr, CoZrTa, CoHf, CoTa, CoTaHf, CoNbHf, CoHfPd, CoTaZrNb and CoZrMoNi, and FeAlSi (Sendust), iron nitride based materials. The top shielding layer 9 may have a thickness in the range of 0.5–10 micrometers.

Figure 6:
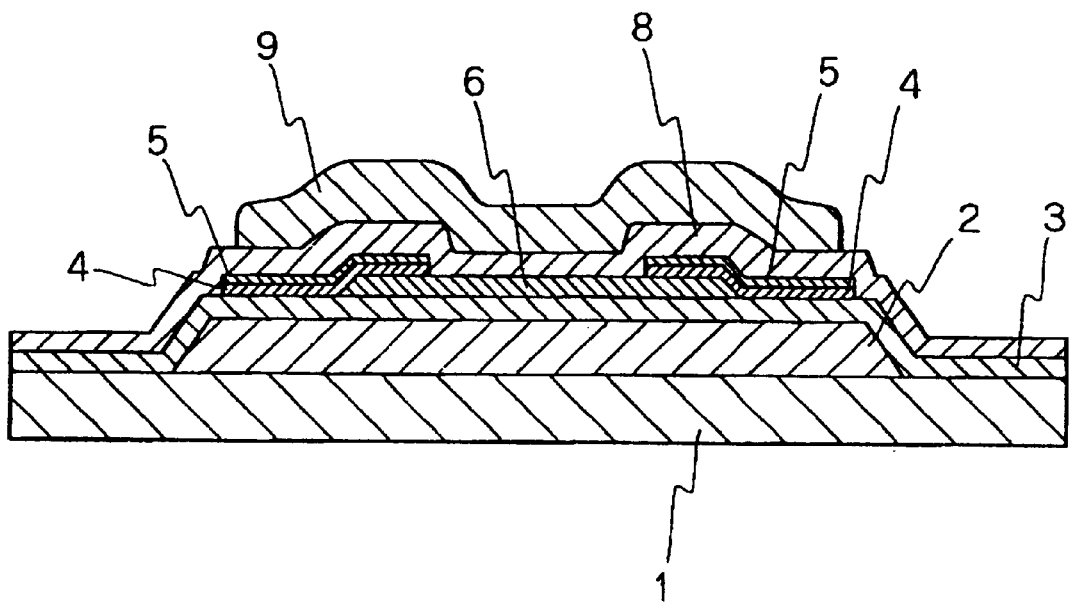
FIG. 6 is a fragmentary cross sectional elevation view illustrative of another magnetoresistive effect sensor in accordance with the present invention.

FIG. 6 is illustrative of another magnetoresistive effect sensor. The magnetoresistive effect sensor is formed on a substrate 1. A bottom shielding layer 2 is selectively provided on a top surface of the substrate 1. The bottom shielding layer 2 has a sloped edge. A bottom gap layer 3 is further provided which extends over the bottom shielding layer 2 and the substrate 1. A magnetoresistive effect element 6 is selectively provided on a top surface of the bottom gap layer 3. The magnetoresistive effect element 6 has a sloped edge. A vertical bias layer 4 is formed which extends on a peripheral region of the top surface of the magnetoresistive effect element 6 and also extends on the sloped portion of the magnetoresistive effect element 6 and further extends around the magnetoresistive effect element 6 and on the top surface of the bottom gap layer 3. The vertical bias layer 4 does not extend over the sloped portion of the bottom gap layer 3. Bottom electrode layers 5 are provided which extend over the vertical bias layer 4. A top gap layer 8 is entirely provided which extends over the magnetoresistive effect element 6, the bottom electrode layer 5, and the sloped portions and the low-leveled portions of the bottom gap layer 3. A top shielding layer 9 is provided which extends over the top gap layer 8.

The bottom shielding layer 2 may be made of one selected from the group consisting of alloys based on NiFe, CoZr, FeAlSi, iron nitride based alloys. The bottom shielding layer 2 may have a thickness in the range of 0.5–10 micrometers. The bottom gap layer 3 may be made of one selected from the group consisting of aluminum oxide, silicone dioxide, aluminum nitride, silicon nitride, diamond like carbon and the like. The bottom gap layer 3 may preferably have a thickness in the range of 0.01–0.20 micrometers. The bottom electrode layer 5 may be made of one selected from the group consisting of Zr, Ta, Mo, alloys thereof, and mixture thereof. The bottom electrode layer 5 may preferably have a thickness in the range of 0.01–0.10 micrometers. The vertical bias layer 4 may be made of one selected from the group consisting of CoCrPt, CoCr, CoPt, CoCrTa, FeMn, Nit, NiO, NiCoO, IrMn, PtPdMn, ReMn, and the like. The top gap layer 8 may be made of one selected from the group consisting of aluminum oxide, silicone dioxide, aluminum nitride, silicon nitride, diamond like carbon and the like. The top gap layer 8 may preferably have a thickness in the range of 0.01–0.20 micrometers.

Figure 7:
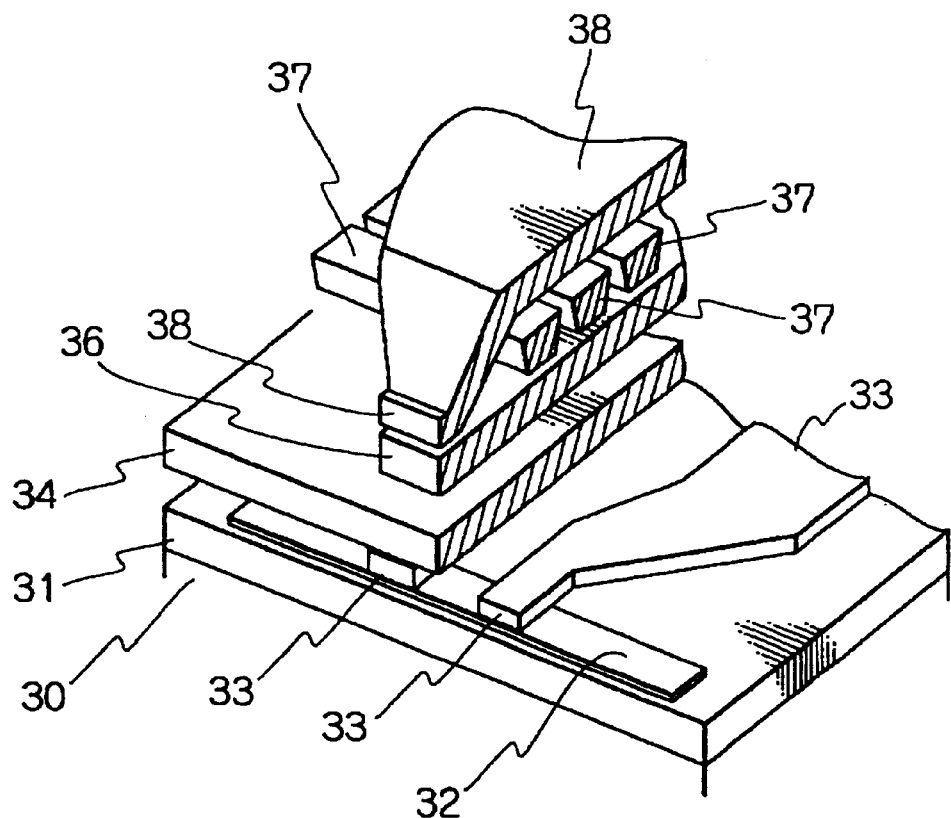
FIG. 7 is a schematic view illustrative of a magnetic recording/reproducing head using a magnetoresistive effect sensor in accordance with the present invention.

The above magnetoresistive effect sensors shown in FIGS. 1 and 6 may be applicable to a recording/reproducing head, wherein a recording head using an inductive coil is united with the magnetoresistive effect sensor. The recording/reproducing head using the above magnetoresistive effect sensor will be described in detail with reference to FIG. 7. The recording/reproducing head comprises a reproducing head using the above magnetoresistive effect sensor in accordance with the present invention and an inductive recording head. Although FIG. 7 illustrates a combination of the magnetoresistive effect sensor with the recording head for longitudinal magnetic recording, there is also available another combination of the magnetoresistive effect sensor with the recording head for vertical magnetic recording. The recording/reproducing head comprises a recording head and a reproducing head. The reproducing head is formed on a substrate 30. The recording head is provided over the reproducing head. The reproducing head comprises a bottom shielding layer 31, a magnetoresistive effect element 32, electrodes 33, and top shielding layer 34. The bottom shielding layer 31 is provided on an entire top surface of the substrate 30. The magnetoresistive effect element 32 is selectively provided on the top surface of the bottom shielding layer 31. The magnetoresistive effect element 32 is the form of a slender strip. A pair of the electrodes 33 are provided which extend over the magnetoresistive effect element 32 and the top surface of the bottom shielding layer 31. The electrodes 33 are distanced at a predetermined gap. The top shielding layer 34 is provided over the electrodes 33. On the other hand, the recording head comprises a bottom magnetic layer 36, coils 37 and a top magnetic layer 38. The bottom magnetic layer 36 is provided over the top shielding layer 34 of the reproducing head. The coils 37 are provided over the bottom magnetic layer 36. The top magnetic layer 38 are provided over the coils 37 and over the bottom magnetic layer 36. The end portions of the top magnetic layer 38 are sloped down to approach the end portions of the bottom magnetic layer 36, for which reason the top magnetic layer 38 is not flat to vary in level whilst the bottom magnetic layer 36 is flat.

As a modification to the above, it is available that the top shielding layer 34 and the bottom magnetic layer 36 are unitary formed to be a single layer. The recording head acts to write signals or data onto a magnetic recording medium, whilst the reproducing head acts to read signals or data out of the magnetic recording medium. As illustrated in FIG. 7, a sensing portion of the reproducing head and a magnetic gap of the recording head are superimposed over the same slider for simultaneous positioning over the same track of the magnetic recording medium. The above head is formed to be a head slider so that the head slider is mounted on the magnetic recording/reproducing device.

Figure 8:
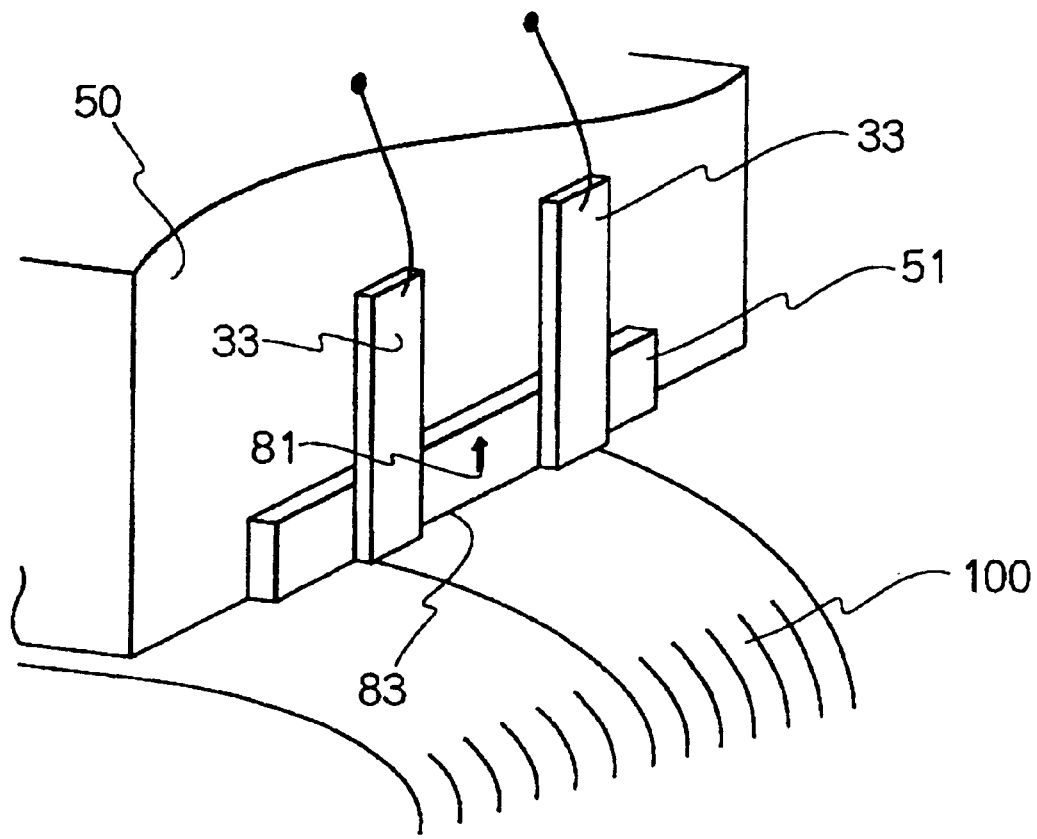
FIG. 8 is a schematic view illustrative of a magnetic recording/reproducing device using a magnetoresistive effect sensor in accordance with the present invention.

FIG. 8 is illustrative of a magnetic recording/reproducing device using a magnetoresistive effect sensor. A substrate 50 acts as a head slider. A magnetoresistive effect element 51 is provided on a lowest area of a front surface of the substrate 50. The magnetoresistive effect element 51 is in the form of a slender strip which horizontally extends along a lowest area of the front surface of the substrate 50. Electrodes 33 are provided on the magnetoresistive effect element 51 and over the front surface of the substrate 50. The electrodes 33 are distanced from each other by a gap between the electrodes 33. The magnetic recording medium 100 rotates so that the head slider shows a relative movement to the magnetic recording medium 100. The head slider is kept to be over 0.2 micrometers or less or in contact with the surface of the magnetic recording medium, so that the magnetoresistive sensor is then positioned over the magnetic recording medium 100 for reading out the signals or data magnetically stored in the magnetic recording medium.

Figure 2:
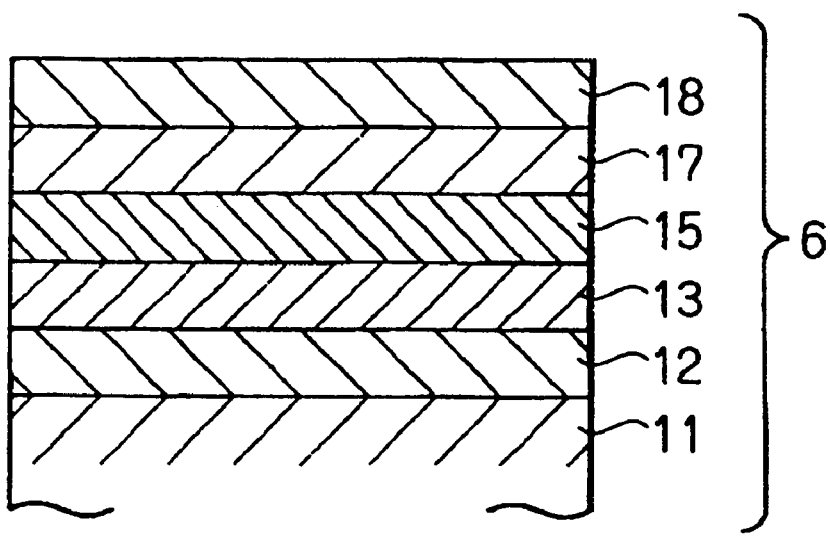
FIG. 2 is a cross sectional elevation view illustrative of a laminated structure of a magnetoresistive effect element in accordance with the present invention.

FIG. 2 is illustrative of a laminated structure of the above magnetoresistive effect element involved in the magnetoresistive effect sensor. The magnetoresistive effect element has the following lamination structure. An anti-ferromagnetic layer 12 is laminated on a base layer 11. A pinned magnetic layer 13 is laminated on anti-ferromagnetic layer 12. A non-magnetic layer 15 is laminated on the pinned magnetic layer 13. A free magnetic layer 17 is laminated on the non-magnetic layer is. A protection layer 18 is laminated on the free magnetic layer 17.

The pinned magnetic layer 13 may be made of one selected from the group consisting of Co-based materials, Ni-based materials, Fe-based materials and alloys thereof. The thickness of the pinned magnetic layer 103 is preferably in the range of about 1–50 nanometers.

The non-magnetic layer 15 may be made of Cu, Cu added with about 1–20at % of Ag, Cu added with about 1–20at % of Re, or Cu—Au alloys. The thickness of the non-magnetic layer 15 is preferably in the range of about 2–4 nanometers.

The free magnetic layer 17 may be made of amorphous magnetic materials, and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi. The free magnetic layer 17 may comprise a single layer made of the above materials or laminated layers. The thickness of the free magnetic layer 17 is preferably in the range of 1–10 nanometers. If the free magnetic layer 17 is made of a material including materials based on NiFe, NiFeCo, or FeCo, then the base layer may be made of Ta, Hf, Zr or W so that the crystal quality of the free magnetic layer 17 and the non-magnetic layer 15 is improved and the magnetoresistive rate is also improved.

The protection layer 18 may be made of oxide or nitirde of the group consisting of Al, Si, Ta, and Ti. Alternatively, the protection layer 18 may also be made of one selected from the group consisting of Cu, Au, Tg, Ta, Hf, Zr, Ir, Si, Pt, Ti, Cr, Al, and C, and mixtures thereof. The protection layer 18 may improve the resistance to corrosion thereof. If, however, the protection layer 18 is not formed, then the corrosion resistance is reduced although the fabrication processes are reduced.

Figure 3:
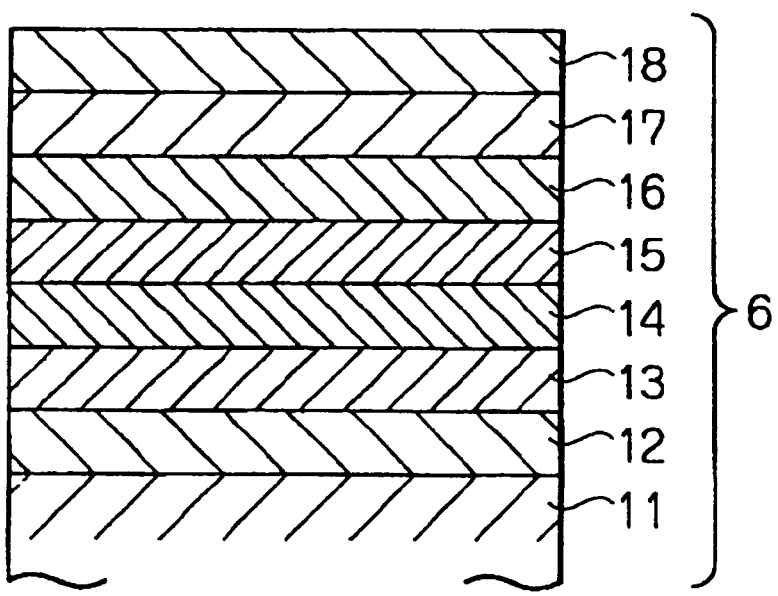
FIG. 3 is a cross sectional elevation view illustrative of a laminated structure of another magnetoresistive effect element in accordance with the present invention.

FIG. 3 is illustrative of a laminated structure of the above magnetoresistive effect element involved in the magnetoresistive effect sensor. The magnetoresistive effect element has the following lamination structure. An anti-ferroelectric layer 12 is laminated on a base layer 11. A pinned magnetic layer 13 is laminated on anti-ferroelectric layer 12. A first magnetoresistive effect enhanced layer 14 is laminated on the pinned magnetic layer 13. A non-magnetic layer 15 is laminated on the first magnetoresistive effect enhanced layer 14. A second magnetoresistive effect enhanced layer 16 is laminated on the non-magnetic layer 15. A free magnetic layer 17 is laminated on the second magnetoresistive effect enhanced layer 16. A protection layer 18 is laminated on the free magnetic layer 17.

The pinned magnetic layer 13 may be made of one selected from the group consisting of Co-based materials, Ni-based materials, Fe-based materials and alloys thereof. The thickness of the pinned magnetic layer 103 is preferably in the range of about 1–50 nanometers.

The first magnetoresistive effect enhanced layer 14 may be made of one selected from the group consisting of amorphous magnetic materials, and alloys based on Co, Fe, Ni, NiFe, NiFeCo FeCo, CoFeB, CoZrMo, CoZrNb, CoZr, CoZrTa, CoHf, CoTa, CoTaHf, CoNbHf, CoHfPd, CoTaZrNb and CoZrMoNi. The thickness of the first magnetoresistive effect enhanced layer 14 is preferably in the range of about 0.5–5 nanometers. If the first magnetoresistive effect enhanced layer is not formed, then the magnetoresistive rate is slightly reduced although the fabrication processes are reduced.

The non-magnetic layer 15 may be made of Cu, Cu added with about 1–20at % of Ag, Cu added with about 1–20at % of Re, or Cu—Au alloys. The thickness of the non-magnetic layer 15 is preferably in the range of about 2–4 nanometers.

The second magnetoresistive effect enhanced layer 16 may be made of one selected from the group consisting of amorphous magnetic materials, and alloys based on Co, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi. The thickness of the second magnetoresistive effect enhanced layer 106 is preferably in the range of about 0.5–3 nanometers. If the second magnetoresistive effect enhanced layer is not formed, then the magnetoresistive rate is slightly reduced although the fabrication processes are reduced.

The free magnetic layer 17 may be made of NiFe, NiFeCo, CoZrNb, CoZrMo, FeCoB, Sendust, iron nitride system, FeCo, or mixture thereof. The free magnetic layer 17 may comprise a single layer made of the above materials or laminated layers. The thickness of the free magnetic layer 17 is preferably in the range of 1–10 nanometers. If the free magnetic layer 17 is made of a material including materials based on NiFe, NiFeCo, or FeCo, then the base layer may be made of Ta, Hf, Zr or W so that the crystal quality of the free magnetic layer 17 and the non-magnetic layer 15 is improved and the magnetoresistive rate is also improved.

The protection layer 18 may be made of oxide or nitirde of the group consisting of Al, Si, Ta, and Ti. Alternatively, the protection layer 18 may also be made of one selected from the group consisting of Cu, Au, Tg, Ta, Hf, Zr, Ir, Si, Pt, Ti, Cr, Al, and C, and mixtures thereof. The protection layer 18 may improve the resistance to corrosion thereof. If, however, the protection layer 18 is not formed, then the corrosion resistance is reduced although the fabrication processes are reduced.

Figure 4:
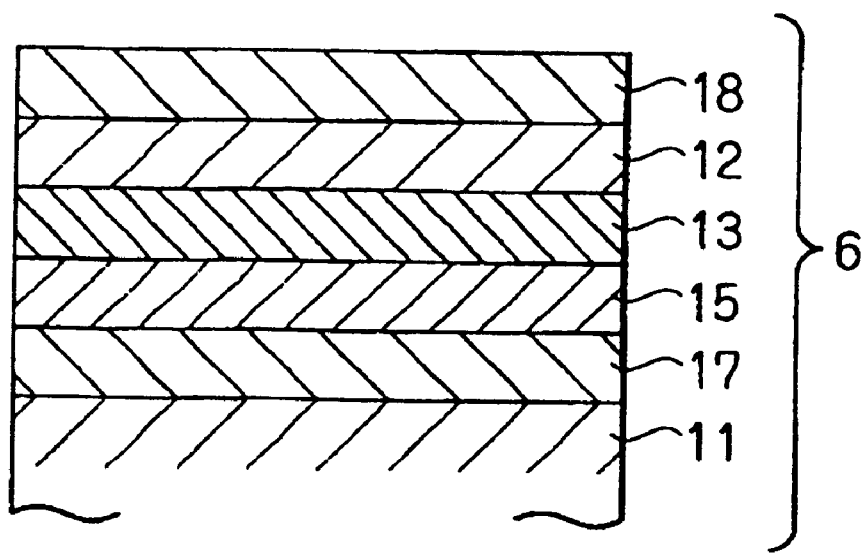
FIG. 4 is a cross sectional elevation view illustrative of a laminated structure of still another magnetoresistive effect element in accordance with the present invention.

FIG. 4 is illustrative of a laminated structure of the above magnetoresistive effect element involved in the magnetoresistive effect sensor. The magnetoresistive effect element has the following lamination structure. A free magnetic layer 17 is laminated on a base layer 11. A non-magnetic layer 15 is laminated on the free magnetic layer 17. A pinned magnetic layer 13 is laminated on the non-magnetic layer 15. An anti-ferroelectric layer 12 is laminated on the pinned magnetic layer 13. A protection layer 18 is laminated on the anti-ferroelectric layer 12, The pinned magnetic layer 13 may be made of one selected from the group consisting of Co-based materials, Ni-based materials, Fe-based materials and alloys thereof The thickness of the pinned magnetic layer 103 is preferably in the range of about 1–50 nanometers.

The non-magnetic layer 15 may be made of Cu, Cu added with about 1–20at % of Ag, Cu added with about 1–20at % of Re, or Cu—Au alloys. The thickness of the non-magnetic layer 15 is preferably in the range of about 2–4 nanometers.

The free magnetic layer 17 may be made of amorphous magnetic materials, and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi. The free magnetic layer 17 may comprise a single layer made of the above materials or laminated layers. The thickness of the free magnetic layer 17 is preferably in the range of 1–10 nanometers.

The protection layer 18 may be made of oxide or nitirde of the group consisting of Al, Si, Ta, and Ti. Alternatively, the protection layer 18 may also be made of one selected from the group consisting of Cu, Au, Tg, Ta, Hf, Zr, Ir, Si, Pt, Ti, Cr, Al, and C, and mixtures thereof. The protection layer 18 may improve the resistance to corrosion thereof If, however, the protection layer 18 is not formed, then the corrosion resistance is reduced although the fabrication processes are reduced.

Figure 5:
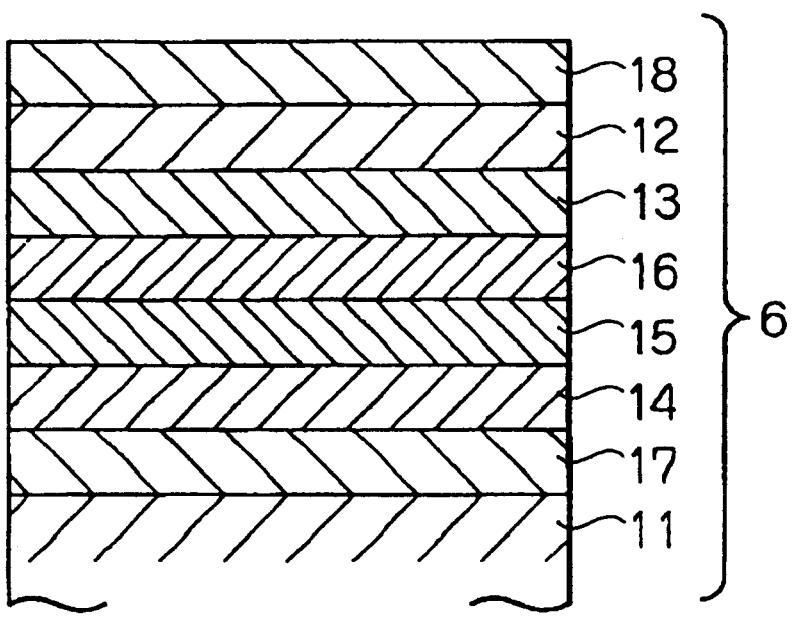
FIG. 5 is a cross sectional elevation view illustrative of a laminated structure of yet another magnetoresistive effect element in accordance with the present invention.

FIG. 5 is illustrative of a laminated structure of the above magnetoresistive effect element involved in the magnetoresistive effect sensor. The magnetoresistive effect element has the following lamination structure. A free magnetic layer 17 is laminated on a base layer 11. A first magnetoresistive effect enhanced layer 14 is laminated on the free magnetic layer 17. A non-magnetic layer 15 is laminated on the first magnetoresistive effect enhanced layer 14. A second magnetoresistive effect enhanced layer 16 is laminated on the non-magnetic layer 15. A pinned magnetic layer 13 is laminated on the second magnetoresistive effect enhanced layer 16. An anti-ferroelectric layer 12 is laminated on the pinned magnetic layer 13. A protection layer 18 is laminated on the anti-ferroelectric layer 12.

The pinned magnetic layer 13 may be made of one selected from the group consisting of Co-based materials, Ni-based materials, Fe-based materials and alloys thereof The thickness of the pinned magnetic layer 103 is preferably in the range of about 1–50 nanometers.

The first magnetoresistive effect enhanced layer 14 may be made of one selected from the group consisting of amorphous magnetic materials, and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi. The thickness of the first magnetoresistive effect enhanced layer 14 is preferably in the range of about 0.5–5 nanometers. If the first magnetoresistive effect enhanced layer is not formed, then the magnetoresistive rate is slightly reduced although the fabrication processes are reduced.

The non-magnetic layer 15 may be made of Cu, Cu added with about 1–20at % of Ag, Cu added with about 1–20at % of Re, or Cu—Au alloys.

The thickness of the non-magnetic layer 15 is preferably in the range of about 2–4 nanometers.

The second magnetoresistive effect enhanced layer 16 may be made of one selected from the group consisting of amorphous magnetic materials, and alloys based on Co, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi. The thickness of the second magnetoresistive effect enhanced layer 106 is preferably in the range of about 0.5–3 nanometers. If the second magnetoresistive effect enhanced layer is not formed, then the magnetoresistive rate is slightly reduced although the fabrication processes are reduced.

The free magnetic layer 17 may be made of NiFe, NiFeCo, CoZrNb, CoZrMo, FeCoB, Sendust, iron nitride system, FeCo, or mixture thereof The free magnetic layer 17 may comprise a single layer made of the above materials or laminated layers. The thickness of the free magnetic layer 17 is preferably in the range of 1–10 nanometers.

The protection layer 18 may be made of oxide or nitirde of the group consisting of Al, Si, Ta, and Ti. Alteratively, the protection layer 18 may also be made of one selected from the group consisting of Cu, Au, Tg, Ta, Hf, Zr, Ir, Si, Pt, Ti, Cr, Al, and C, and mixtures thereof The protection layer 18 may improve the resistance to corrosion thereof If, however, the protection layer 18 is not formed, then the corrosion resistance is reduced although the fabrication processes are reduced.

For comparison with the present invention, the magnetoresistive effect element is formed which comprises a lamination structure of a glass substrate/NiO(50 nm)/$Co_{90}Fe_{10}$(3 nm)/Cu(2.5 nm)/$Co_{90}Fe_{10}$(1 nm)/$Ni_{80}Fe_{20}$ (5 nm). The above layers are grown by magnetron sputtering system under application of magnetic field of 500 Oe. The magnetic field is applied in a direction parallel to the magnetic field of the layer in order to draw M-H curve. The measured rate of resistance variation is 7%. The measured resistivity of the magnetoresistive effect element is 25[$\mu\Omega$cm] under no application of magnetic field. An amount of variation in resistivity of the magnetoresistive effect element is 1.75[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{92}Zr_8$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.5%. The measured resistivity of the magnetoresistive effect element is 50[$\mu\Omega$cm] under no application of magnetic field. An amount of variation in resistivity of the magnetoresistive effect element is 3.2[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)$Co_{83}Zr_{17}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.0%. The measured resistivity of the magnetoresistive effect element is 62[$\mu\Omega$cm] under no application of magnetic field. An amount of variation in resistivity of the magnetoresistive effect element is 3.1[$\mu\Omega$cm].

In accordance with the present invention, the magnetoresistive effect element is formed which comprises a lamination structure of glass substrate/NiO(50 nm)/$Co_{90}Fe_{10}$(3 nm)/Cl(2.5 nm)/$Co_{92}Hf_8$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.2%. The measured resistivity of the magnetoresistive effect element is 52[$\mu\Omega$cm] under no application of magnetic field. An amount of variation in resistivity of the magnetoresistive effect element is 3.2[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{83}Ta_{17}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.3%. The measured resistivity of the magnetoresistive effect element is 64[$\mu\Omega$cm] under no application of magnetic field. An amount of variation in resistivity of the magnetoresistive effect element is 3.4[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{83}Ta_{17}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.4%. The measured resistivity of the magnetoresistive effect element is 51[$\mu\Omega$cm] under no application of magnetic field. An amount of variation in resistivity of the magnetoresistive effect element is 3.3[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.7%. The measured resistivity of the magnetoresistive effect element is 63[$\mu\Omega$cm] under no application of magnetic field. An amount of variation in resistivity of the magnetoresistive effect element is 4.2[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{92}Hf_5Pd_3$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.5%. The measured resistivity of the magnetoresistive effect element is 63[$\mu\Omega$cm] under no application of magnetic field. An amount of variation in resistivity of the magnetoresistive effect element is 4.1[$\mu\Omega$cm].

In accordance with the present invention, the magnetoresistive effect element is formed which comprises a lamination structure of glass substrate/NiO(50 nm)/$Co_{90}Fe_{10}$(3 nm)/Cu(2.5 nm)/$Co_{88}Ta_8Hf_4$(6 nm). Those layers are grown by magnetron sputtering system under application of magnetic field of 500 Oe, The magnetic field is applied in a direction parallel to the magnetic field of the layer in order to draw M-H curve. The measured rate of resistance variation is 5.8%. The measured resistivity of the magnetoresistive effect element is 59[$\mu\Omega$cm] under no application of magnetic field. An amount of variation in resistivity of the magnetoresistive effect element is 3.4[$\mu$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{87}$Nb$_9$Hf$_4$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.5%. The measured resistivity of the magnetoresistive effect element is 57[$\mu\Omega$cm] under no application of magnetic field. An amount of variation in resistivity of the magnetoresistive effect element is 3.1[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{87}$Ta$_9$Zr$_4$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.4%. The measured resistivity of the magnetoresistive effect element is 59[$\mu\Omega$cm] under no application of magnetic field. An amount of variation in resistivity of the magnetoresistive effect element is 3.2[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{86}$Nb$_9$Zr$_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.8%. The measured resistivity of the magnetoresistive effect element is 61[$\mu\Omega$cm] under no application of magnetic field. An amount of variation in resistivity of the magnetoresistive effect element is 3.5[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{92}$Zr$_4$Ta$_4$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.1%. The measured resistivity of the magnetoresistive effect element is 58[$\mu\Omega$cm] under no application of magnetic field. An amount of variation in resistivity of the magnetoresistive effect element is 3.5[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{79}$Zr$_{10}$Mo$_9$Ni$_2$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.8%. The measured resistivity of the magnetoresistive effect element is 66[$\mu\Omega$cm] under no application of magnetic field. An amount of variation in resistivity of the magnetoresistive effect element is 3.8[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{82.5}$Zr$_{5.5}$Ta$_4$Nb$_8$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.5%. The measured resistivity of the magnetoresistive effect element is 62[$\mu\Omega$cm] under no application of magnetic field. An amount of variation in resistivity of the magnetoresistive effect element is 3.4[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{74}$Zr$_6$Mo$_{20}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 5.8%. The measured resistivity of the magnetoresistive effect element is 70[$\mu\Omega$cm] under no application of magnetic field. An amount of variation in resistivity of the magnetoresistive effect element is 4.1[$\mu\Omega$cm].

In accordance with the present invention, the magnetoresistive effect element is formed which comprises a lamination structure of glass substrate/NiO(50 nm)/Co$_{90}$Fe$_{10}$(3 nm)/Cu(2.5 nm)/Co$_{72}$Fe$_8$B$_{20}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.9%. The measured resistivity of the magnetoresistive effect element is 72[$\mu\Omega$cm] under no application of magnetic field. An amount of variation in resistivity of the magnetoresistive effect element is 3.5[$\mu\Omega$cm].

In accordance with the present invention, the magnetoresistive effect element is formed which comprises a lamination structure of glass substrate/NiO(50 nm)/Co$_{90}$Fe$_{10}$(1.5 nm)/Co$_{74}$Zr$_6$Mo$_{20}$(1.5 nm)/Cu(2.5 nm)/Co$_{74}$Zr$_6$Mo$_{20}$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.0%. The measured resistivity of the magnetoresistive effect element is 65[$\mu\Omega$cm] under no application of magnetic field. An amount of variation in resistivity of the magnetoresistive effect element is 3.9[$\mu\Omega$cm].

In accordance with the present invention, the magnetoresistive effect element is formed which comprises a lamination structure of glass substrate/NiO(50 nm)/Co$_{90}$Fe$_{10}$(1.5 nm)Co$_{74}$Zr$_6$Mo$_{20}$(1.5 nm)/Cu(2.5 nm)/Co$_{74}$Zr$_6$Mo$_{20}$(3 nm)/Ni$_{80}$Fe$_{20}$. Those layers are grown by magnetron sputtering system under application of magnetic field of 500 Oe. The magnetic field is applied in a direction parallel to the magnetic field of the layer in order to draw M-H curve. The measured rate of resistance variation is 5.0%. The measured resistivity of the magnetoresistive effect element is 45[$\mu\Omega$cm] under no application of magnetic field. An amount of variation in resistivity of the magnetoresistive effect element is 2.25[$\mu\Omega$cm].

In accordance with the present invention, the magnetoresistive effect element is formed which comprises a lamination structure of glass substrate/NiO(50 nm)/Co$_{90}$Fe$_{10}$(3.0 nm)/Cu(2.5 nm)/Co$_{90}$Zr$_3$Nb$_5$(3 nm)/Ru(0.4 nm)/Co$_{92}$Zr$_3$Nb$_5$(3 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.8%. If this lamination stricture is patterned to have a width of 1 micrometer, then a high magnetic sensitivity can be obtained. The two $Co_{90}Zr_3Nb_5$(3 nm) layers isolated by the Ru(0.4 nm) layer are anti-ferromagnetically coupled via the Ru(0.4 nm) layer, for which reason an effective magnetization of the free magnetic layer is extremely small whereby a static magnetic coupling between the pinned magnetic layer and the free magnetic layer is small. The measured resistivity of the magnetoresistive effect element is 43[$\mu\Omega$cm] under no application of magnetic field. An amount of variation in resistivity of the magnetoresistive effect element is 2.1[$\mu\Omega$cm].

In accordance with the present invention, the magnetoresistive effect element is formed which comprises a lamination structure of glass substrate/NiO(50 nm)/$Co_{90}Fe_{10}$(2 nm)/Ru(0.4 nm)/$Co_{90}Fe_{10}$(2 nm)/Cu(2.5 nm)/$Co_{92}Zr_3Nb_5$(3 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.9%. If this lamination structure is patterned to have a width of 1 micrometer, then a high magnetic sensitivity can be obtained. The two $Co_{90}Fe_{10}$(2 nm) layers isolated by the Ru(0.4 nm) layer are anti-ferromagnetically coupled via the Ru(0.4 nm) layer, for which reason an effective magnetization of the free magnetic layer is extremely small whereby a static magnetic coupling between the pinned magnetic layer and the free magnetic layer is small. The measured resistivity of the magnetoresistive effect element is 41[$\mu\Omega$cm] under no application of magnetic field. An amount of variation in resistivity of the magnetoresistive effect element is 2.0[$\mu\Omega$cm].

In accordance with the present invention, the magnetoresistive effect element is formed which comprises a lamination structure of glass substrate/NiO(50 nm)/$Co_{90}Fe_{10}$(3 nm)/Ru(0.4 nm)/$Co_{90}Fe_{10}$(3 nm)/Cu(2.5 nm)/$Co_{92}Zr_3Nb_5$(3 nm)Ru(0.4 nm)/$Co_{92}Zr_3Nb_5$(3 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.5%. If this lamination structure is patterned to have a width of 1 micrometer, then a high magnetic sensitivity can be obtained. The two $Co_{92}Zr_3Nb_5$(3 nm) layers isolated by the Ru(0.4 nm) layer are anti-ferromagnetically coupled via the Ru(0.4 nm) layer, for which reason an effective magnetization of the free magnetic layer is extremely small whereby a static magnetic coupling between the pinned magnetic layer and the free magnetic layer is small. The measured resistivity of the magnetoresistive effect element is 38[$\mu\Omega$cm] under no application of magnetic field. An amount of variation in resistivity of the magnetoresistive effect element is 1.7[$\mu\Omega$cm].

In accordance with the present invention, the magnetoresistive effect element is formed which comprises a lamination structure of NiO(50 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.75%. The measured resistivity of the magnetoresistive effect element is 63[$\mu\Omega$cm] under no application of magnetic field. An amount of variation in resistivity of the magnetoresistive effect element is 4.2[$\mu\Omega$cm].

In accordance with the present invention, the magnetoresistive effect element is formed which comprises a lamination structure of FeMn(10 nm)/$Co_{90}Fe_{10}$(3 nm)/Cu(2.5 nm)$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.5%. The measured resistivity of the magnetoresistive effect element is 58[$\mu\Omega$cm] under no application of magnetic field. An amount of variation in resistivity of the magnetoresistive effect element is 2.6[$\mu\Omega$cm].

In accordance with the present invention, the magnetoresistive effect element is formed which comprises a lamination structure of NiMn(30 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.2%. The measured resistivity of the magnetoresistive effect element is 46[$\mu\Omega$cm] under no application of magnetic field. An amount of variation in resistivity of the magnetoresistive effect element is 1.9[$\mu\Omega$cm].

In accordance with the present invention, the magnetoresistive effect element is formed which comprises a lamination structure of IrMn(30 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 4.5%. The measured resistivity of the magnetoresistive effect element is 57[$\mu\Omega$cm] under no application of magnetic field. An amount of variation in resistivity of the magnetoresistive effect element is 2.6[$\mu\Omega$cm].

In accordance with the present invention, the magnetoresistive effect element is formed which comprises a lamination structure of PtPdMn(30 nm)/$Co_{90}Fe_{10}$(3 nm)/Cu(2.5 nm)/$Co_{92}Zr_3Nb_5$(6 nm) Those layers are grown by magnetron sputtering system under application of magnetic field of 500 Oe. The magnetic field is applied in a direction parallel to the magnetic field of the layer in order to draw M-H curve. The measured rate of resistance variation is 4.5%. The measured resistivity of the magnetoresistive effect element is 56[$\mu\Omega$cm] under no application of magnetic field. An amount of variation in resistivity of the magnetoresistive effect element is 2.5[$\mu\Omega$cm].

In accordance with the present invention, the magnetoresistive effect element is formed which comprises a lamination structure of NiO(50 nm)/CoO(1 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 7.0%. The measured resistivity of the magnetoresistive effect element is 63[$\mu\Omega$cm] under no application of magnetic field. An amount of variation in resistivity of the magnetoresistive effect element is 4.4[$\mu\Omega$cm].

In accordance with the present invention, the magnetoresistive effect element is formed which comprises a lamination structure of NiO(50 nm)/FeO(2 nm)/$Co_{90}Fe_{10}$(3 nm)/Cu(2.5 nm)/$Co_{92}Zr_3Nb_5$(6 nm). Those layers are grown by magnetron sputtering system under application of magnetic field of 500 Oe. The magnetic field is applied in a direction parallel to the magnetic field of the layer in order to draw M-H curve. The measured rate of resistance variation is 6.5%. The measured resistivity of the magnetoresistive effect element is 62[$\mu\Omega$cm] under no application of magnetic field. An amount of variation in resistivity of the magnetoresistive effect element is 4.0[$\mu\Omega$cm].

The magnetoresistive effect sensor of FIG. 1 is formed. The bottom shielding layer is made of NiFe. The bottom gap layer is made of alumimum oxide. The magnetoresistive effect element has a lamination structure of NiO(50 nm)/FeO(2 nm)/$Co_{90}Fe_{10}$(3 nm)/Cu(2.5 nm)/$Co_{90}Zr_3$ $Nb_5$(26 nm). By photo-lithography process, the laminations are patterned to 1×1 micrometers. The bottom electrodes of CoCrPt and Mo are laminated on the edge of the above laminations. The top gap layer is made of aluminum oxide. The top shielding layer is made of NiFe. From the above magnetoresistive effect sensor, the magnetic recording/reproducing head slider of FIG. 7 is formed. CoCrTa system magnetic medium is used for magnetic recording and reproducing. A width of the write track is 1.5 micrometers. A gap of the write gap is 0.2 micrometers. A width of the read track is 1.0 micrometers. A gap of the read gap is 0.21 micrometers. The coercive force of the magnetic recording medium is 2.5 kOe. The reproducing output is measured by changing the recording mark length. The frequency is 150 kFCI at a mark length where the reproducing output is reduced by half. The reproducing output is 2.7 mV at peak-to-peak. Noise free symmetrical waveforms are obtained. The signal to noise ratio is 26.3 dB. The error rate is not more than $1\times10^{-6}$. This head is tested at 80° C. and 500 Oe. The error rate remains unchanged for 1500 hours.

The above anti-ferromagnetic layer is applied to the magnetoresistive effect element. The magnetoresistive effect sensor of FIG. 6 is formed. The bottom shielding layer is made of FeTaN. The bottom gap layer is made of amorphous carbon. The magnetoresistive effect element has a lamination structure of NiO(50 nm)/FeO(2 nm)/$Co_{90}Fe_{10}$(3 nm) /Cu(2.5 nm)/$Co_{92}Zr_3Nb_5$(6 nm). By photo-lithography process, the laminations are patterned to 1×1 micrometers. The bottom electrodes of CoCrPt and Mo are laminated on part of the above laminations. The top gap layer is made of aluminum oxide. The top shielding layer is made of NiFe. From the above magnetoresistive effect sensor, the magnetic recording/reproducing head slider of FIG. 7 is formed. CoCrTa system magnetic medium is used for magnetic recording and reproducing. A width of the write track is 1.5 micrometers. A gap of the write gap is 0.2 micrometers. A width of the read track is 1.0 micrometers. A gap of the read gap is 0.21 micrometers. The coercive force of the magnetic recording medium is 2.5 kOe. The reproducing output is measured by changing the recording mark length. The frequency is 150 kFCI at a mark length where the reproducing output is reduced by half The reproducing output is 2.8 mV at peak-to-peak. Noise free symmetrical waveforms are obtained. The signal to noise ratio is 26.6 dB. The error rate is not more than $1\times10^{-6}$. This head is tested at 80° C. and 500 Oe. The error rate remains unchanged for 1500 hours.

The magnetoresistive effect element of the present invention is applied to the magnetic disc device. The magnetic disc device has three magnetic discs over a base. A head driving circuit, signal processing circuit and input/output interface are accommodated on a bottom surface of the base. The magnetic disc device is connected to an external device via 32-bit bus line. Six heads are positioned over opposite surfaces of the three magnetic discs. A rotary actuator, driving and controlling circuits, and a spindle motor for disc rotation are mounted. A diameter of the discs is 46 millimeters. Data are stored in the area of 10–40 millimeters in diameter of the disc. The buried servo system is used. No exposed servo surface exists for high density recording. This device is directly connectable to the computer as external memory. A cache memory is mounted for the input/output interface for response to the bus line of a transmission rate of 5–20 Mbytes. It is possible to connect a plurality of the above disc devices under the control of an external controller for realizing a large capacity magnetic disc device.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multi-layer structure comprising:

an antiferromagnetic layer;

a pinned magnetic layer in contact with said antiferromagnetic layer; and an additional layered region in contact with said pinned magnetic layer so that said pinned magnetic layer is sandwiched between said antiferromagnetic layer and said additional layered region, wherein said pinned magnetic layer includes at least one selected from the group consisting of Co-based materials, Ni-based materials, Fe-based materials and alloys thereof, and wherein said additional layered region includes at least a first layer made of at least one material selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb, and CoZrMoNi.

2. The multi-layer structure as claimed in claim 1, wherein said at least a first layer is at least a free magnetic layer.

3. The multi-layer structure as claimed in claim 2, wherein said additional layered region comprises:

a first non-magnetic layer in contact with said pinned magnetic layer so that said pinned magnetic layer is sandwiched between said first non-magnetic layer and said anti-ferromagnetic layer; and said at least a free magnetic layer in contact with said first non-magnetic layer so that said first non-magnetic layer is sandwiched between said pinned magnetic layer and said at least a free magnetic layer.

4. The multi-layer structure as claimed in claim 3, wherein said at least a free magnetic layer comprises:

a first free magnetic layer in contact with said first non-magnetic layer so that said first non-magnetic layer is sandwiched between said pinned magnetic layer and said first free magnetic layer;

a second non-magnetic layer in contact with said first free magnetic layer so that said first free magnetic layer is sandwiched between said first non-magnetic layer and said second non-magnetic layer; and a second free magnetic layer in contact with said second non-magnetic layer so that said second non-magnetic layer is sandwiched between said first free magnetic layer and said second free magnetic layer.

5. The multi-layer structure as claimed in claim 1, wherein said at least a first layer is at least a magnetoresistive effect enhanced layer.

6. The multi-layer structure as claimed in claim 5, wherein said additional layered region comprises:

an intermediate layer in contact with said pinned magnetic layer so that said pinned magnetic layer is sandwiched between said intermediate layer and said anti-ferromagnetic layer, said intermediate layer including at least a first non-magnetic layer and said at least a magnetoresistive effect enhanced layer; and at least a free magnetic layer in contact with said intermediate layer so that said intermediate layer is sandwiched between said pinned magnetic layer and said at least a free magnetic layer.

7. The multi-layer structure as claimed in claim 6, wherein said intermediate layer comprises:

a first magnetoresistive effect enhanced layer in contact with said pinned magnetic layer so that said pinned magnetic layer is sandwiched between said first magnetoresistive effect enhanced layer and said anti-ferromagnetic layer;

a first non-magnetic layer in contact with said first magnetoresistive effect enhanced layer so that said first magnetoresistive effect enhanced layer is sandwiched between said pinned magnetic layer and said first non-magnetic layer; and a second magnetoresistive effect enhanced layer in contact with said second non-magnetic layer so that said first non-magnetic layer is sandwiched between said fist magnetoresistive effect enhanced layer and said second magnetoresistive effect enhanced layer.

8. The multi-layer structure as claimed in claim 6, wherein said intermediate layer comprises:

a first magnetoresistive effect enhanced layer in contact with said pinned magnetic layer so that said pinned magnetic layer is sandwiched between said first magnetoresistive effect enhanced layer and said anti-ferromagnetic layer; and a first non-magnetic layer in contact with said first magnetoresistive effect enhanced layer so that said first magnetoresistive effect enhanced layer is sandwiched between said pinned magnetic layer and said first non-magnetic layer.

9. The multi-layer structure as claimed in claim 6, wherein said intermediate layer comprises:

a first non-magnetic layer in contact with said pinned magnetic layer so that said pinned magnetic layer is sandwiched between said first non-magnetic layer and said anti-ferromagnetic layer; and a first magnetoresistive effect enhanced layer in contact with said first non-magnetic layer so that said first non-magnetic layer is sandwiched between said pinned magnetic layer and said first magnetoresistive effect enhanced layer.

10. The multi-layer structure as claimed in claim 6, wherein said at least a free magnetic layer comprises:

a first free magnetic layer in contact with said intermediate layer so that said intermediate layer is sandwiched between said pinned magnetic layer and said first free magnetic layer;

a second non-magnetic layer in contact with said first free magnetic layer so that said first free magnetic layer is sandwiched between said intermediate layer and said second non-magnetic layer; and a second free magnetic layer in contact with said second non-magnetic layer so that said second non-magnetic layer is sandwiched between said first free magnetic layer and said second free magnetic layer.

11. The multi-layer structure as claimed in claim 6, wherein said at least a free magnetic layer is made of the same material as said at least a magnetoresistive effect enhanced layer.

12. The multi-layer structure as claimed in claim 6, wherein said at least a free magnetic layer is made of a material which is different from said at least a magnetoresistive effect enhanced layer, and which includes at least one selected from the group consisting of amorphous magnetic materials, iron nitride based materials, Sendust and alloys based on Co, Fe, Ni, NiFe, NiFeCo, FeCo, CoFeB, CoZrMo, CoZrNb, CoZr, CoZrTa, CoHf, CoTa, CoTaHf, CoNbHf, CoHfPd, CoTaZrNb and CoZrMoNi.

13. The multi-layer structure as claimed in claim 1, wherein said pinned magnetic layer comprises a single layer made of at least one selected from the group consisting of Co-based materials, Ni-based materials, Fe-based materials and alloys thereof.

14. The multi-layer structure as claimed in claim 1, wherein said pinned magnetic layer comprises a plurality of laminated layers, each of which is made of at least one selected from the group consisting of Co-based materials, Ni-based materials, Fe-based materials and alloys thereof.

15. The multi-layer structure as claimed in claim 14, wherein said plurality of laminated layers are made of the same material as each other.

16. The multi-layer structure as claimed in claim 14, wherein said plurality of laminated layers are made of different materials from each other.

17. The multi-layer structure as claimed in claim 14, wherein said plurality of laminated layers are separated from each other by at least a third non-magnetic layer.

18. The multi-layer structure as claimed in claim 1, further comprising a base layer in contact with said anti-ferromagnetic layer so that said anti-ferromagnetic layer is sandwiched between said base layer and said pinned magnetic layer.

19. The multi-layer structure as claimed in claim 1, further comprising a base layer in contact with said additional layered region so that said additional layered region is sandwiched between said base layer and said pinned magnetic layer.

20. A multi-layer structure comprising:

an antiferromagnetic layer;

a pinned magnetic layer in contact with said antiferromagnetic layer;

a first non-magnetic layer in contact with said pinned magnetic layer so that said pinned magnetic layer is sandwiched between said first non-magnetic layer and said anti-ferromagnetic layer; and at least a free magnetic layer in contact with said first non-magnetic layer so that said first non-magnetic layer is sandwiched between said pinned magnetic layer and said at least a free magnetic layer, wherein said pinned magnetic layer includes at least one selected from the group consisting of Co-based materials, Ni-based materials, Fe-based materials and alloys thereof, and wherein said at least a free magnetic layer is made of at least one material selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

21. The multi-layer structure as claimed in claim 20, wherein said at least a free magnetic layer comprises:

a first free magnetic layer in contact with said first non-magnetic layer so that said first non-magnetic layer is sandwiched between said pinned magnetic layer and said first free magnetic layer;

a second non-magnetic layer in contact with said first free magnetic layer so that said first free magnetic layer is sandwiched between said first non-magnetic layer and said second non-magnetic layer and a second free magnetic layer in contact with said second non-magnetic layer so that said second non-magnetic layer is sandwiched between said first free magnetic layer and said second free magnetic layer.

22. The multi-layer structure as claimed in claim 20, wherein said pinned magnetic layer comprises a single layer made of at least one selected from the group consisting of Co-based materials, Ni-based materials, Fe-based materials and alloys thereof.

23. The multi-layer structure as claimed in claim 20, wherein said pinned magnetic layer comprises a plurality of laminated layers, each of which is made of at least one selected from the group consisting of Co-based materials, Ni-based materials, Fe-based materials and alloys thereof.

24. The multi-layer structure as claimed in claim 23, wherein said plurality of laminated layers are made of the same material as each other.

25. The multi-layer structure as claimed in claim 23, wherein said plurality of laminated layers are made of different materials from each other.

26. The multi-layer structure as claimed in claim 23, wherein said plurality of laminated layers are separated from each other by at least a third non-magnetic layer.

27. The multi-layer structure as claimed in claim 20, further comprising a base layer in contact with said anti-ferromagnetic layer so that said anti-ferromagnetic layer is sandwiched between said base layer and said pinned magnetic layer.

28. The multi-layer structure as claimed in claim 20, further comprising a base layer in contact with said at least a free magnetic layer so that said at least a free magnetic layer is sandwiched between said base layer and said first non-magnetic layer.

29. A magnetoresistive effect element comprising:
   a base layer;
   an antiferromagnetic layer extending over said base layer;
   a pinned magnetic layer extending over said antiferromagnetic layer;
   a first non-magnetic layer extending over said pinned magnetic layer; and
   a free magnetic layer extending over said first non-magnetic layer,
   wherein said pinned magnetic layer includes at least one selected from the group consisting of Co-based materials, Ni-based materials, Fe-based materials and alloys thereof, and
   wherein said free magnetic layer is made of at least one material selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

30. The magnetoresistive effect element as claimed in claim 29, wherein said free magnetic layer comprises:
   a first free magnetic layer extending over said first non-magnetic layer;
   a second non-magnetic layer extending over said first free magnetic layer; and
   a second free magnetic layer extending over said second non-magnetic layer.

31. The magnetoresistive effect element as claimed in claim 29, wherein said pinned magnetic layer comprises a single layer made of at least one selected from the group consisting of Co-based materials, Ni-based materials, Fe-based materials and alloys thereof.

32. The magnetoresistive effect element as claimed in claim 29, wherein said pinned magnetic layer comprises a plurality of laminated layers, each of which is made of at least one selected from the group consisting of Co-based materials, Ni-based materials, Fe-based materials and alloys thereof.

33. The magnetoresistive effect element as claimed in claim 32, wherein said plurality of laminated layers are made of the same material as each other.

34. The magnetoresistive effect element as claimed in claim 32, wherein said plurality of laminated layers are made of different materials from each other.

35. The magnetoresistive effect element as claimed in claim 32, wherein said plurality of laminated layers are separated from each other by at least a third non-magnetic layer.

36. A magnetoresistive effect sensor comprising:
   a substrate;
   a bottom shielding layer selectively provided on a part of said substrate;
   a bottom gap layer extending over said bottom shielding layer and said substrate;
   a magnetoresistive effect element selectively provided on a predetermined area of said bottom gap layer;
   a vertical bias layer selectively provided which extends over the bottom gap layer and also so extends as to be in contact partially with said magnetoresistive effect element;
   a bottom electrode layer provided on the vertical bias layer;
   a bottom electrode layer provided on the vertical bias layer;
   a top gap layer extending over said magnetoresistive effect element, said bottom electrode layer and said bottom gap layer; and
   a top shielding layer provided on said top gap layer,
   wherein said magnetoresistive effect element comprising:
      a base layer formed on said bottom gap layer;
      an antiferromagnetic layer extending over said base layer;
      a pinned magnetic layer extending over said antiferromagnetic layer;
      a first non-magnetic layer extending over said pinned magnetic layer; and
      a free magnetic layer extending over said first non-magnetic layer,
      wherein said pinned magnetic layer includes at least one selected from the group consisting of Co-based materials, Ni-based materials, Fe-based materials and alloys thereof, and
      wherein said free magnetic layer is made of at least one material selected from the group consisting of amorphous magnetic materials, CoFeB, CoZrMo, CoZrNb, CoZr, CoZrTa, CoHf, CoTa, CoTaHf, CoNbHf, CoHfPd, CoTaZrNb and CoZrMoNi.

37. The magnetoresistive effect sensor as claimed in claim 36, wherein said free magnetic layer comprises:

a first free magnetic layer extending over said first non-magnetic layer;

a second non-magnetic layer extending over said first free magnetic layer; and a second free magnetic layer extending over said second non-magnetic layer.

38. The magnetoresistive effect sensor as claimed in claim 36, wherein said pinned magnetic layer comprises a single layer made of at least one selected from the group consisting of Co-based materials, Ni-based materials, Fe-based materials and alloys thereof.

39. The magnetoresistive effect sensor as claimed in claim 36, wherein said pinned magnetic layer comprises a plurality of laminated layers, each of which is made of at least one selected from the group consisting of Co-based materials, Ni-based materials, Fe-based materials and alloys thereof.

40. The magnetoresistive effect sensor as claimed in claim 39, wherein said plurality of laminated layers are made of the same material as each other.

41. The magnetoresistive effect sensor as claimed in claim 39, wherein said plurality of laminated layers are made of different materials from each other.

42. The magnetoresistive effect element as claimed in claim 39, wherein said plurality of laminated layers are separated from each other by at least a third non-magnetic layer.

* * * * *